Dec. 15, 1970 J. P. STRÖM ET AL 3,548,312

DEVICE FOR TRANSMITTING AN ACCURATELY DETERMINED FIXED FREQUENCY WITH A TUNABLE HIGH FREQUENCY TRANSMITTER TUBE

Filed Nov. 6, 1967 2 Sheets-Sheet 1

INVENTOR.
JOHAN PAUL STROM
NILS ARNE ERLAND WASTERLI
BY
Frank R. Trifari
AGENT

INVENTOR.
JOHAN PAUL STROM
NILS ARNE ERLAND WASTERLII
BY
Frank R. [signature]
AGENT United States Patent Office 3,548,312
Patented Dec. 15, 1970

3,548,312
DEVICE FOR TRANSMITTING AN ACCURATELY DETERMINED FIXED FREQUENCY WITH A TUNABLE HIGH FREQUENCY TRANSMITTER TUBE

Johan Paul Ström, Jakobsberg, and Nils Arne Erland Wästerlid, Skalby, Sweden, assignors, by mesne assignments, to U.S. Philips Corporation, New York, N.Y., a corporation of Delaware Filed Nov. 6, 1967, Ser. No. 680,693
Claims priority, application Sweden, Nov. 17, 1966, 15,778/66
Int. Cl. H03b 21/00
U.S. Cl. 325—131 5 Claims

ABSTRACT OF THE DISCLOSURE

A device for transmitting an accurately determined fixed frequency with a tunable high frequency tube, i.e., a variable frequency magnetron, which comprises a tuning body rotatably supported in a stator. By rotation in a given direction, this tuning body produces a continuous variation of the tuning frequency of the tube. For the purpose of adjusting the tube to a fixed frequency, the tuning body cooperates with an arresting device arranged between the stator and the tuning body. The arresting device is ineffective during rotation which produces the variation of the tuning frequency, but functions with a tendency toward rotation in the opposite direction, thus locking the tuning body in a position corresponding to the predetermined fixed frequency.

Figure 1:
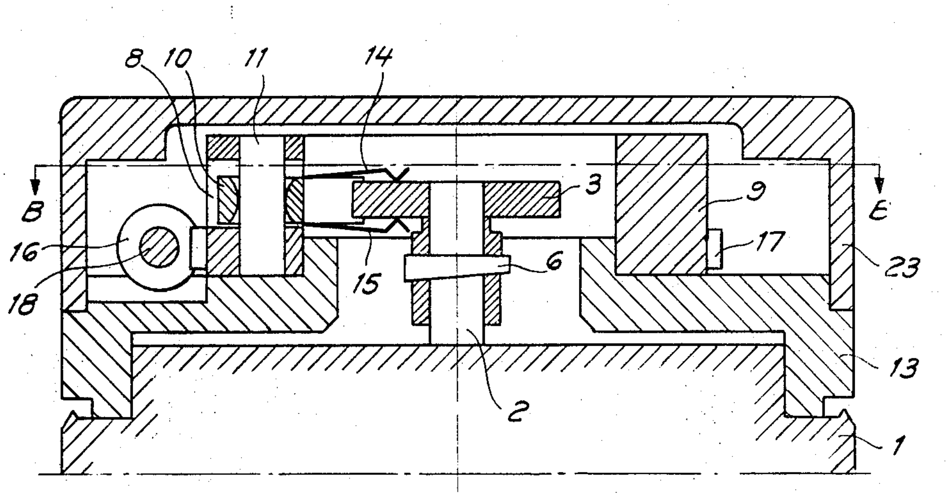

The invention refers to a device in a continuously tunable high frequency tube comprising a rotatable tuning body driven by a motor, the tuning frequency being determined by the instantaneous angular position of the said body. More particularly, the invention relates to a device for making possible transmission of an accurately determined, suitably adjustable fixed frequency by means of such a transmitter tube. The tunable transmitter tube is used in radar equipment and the like and is normally operated such that triggering of the tube is effected under continuous variation of the tuning frequency at moments which are not correlated with the variations in the tuning frequency, whereby the produced pulses will have a frequency which varies at random from pulse to pulse. This will inter alia make it difficult to disturb the radar equipment. In some applications it can, however, be required to transmit pulses having one and the same accurately predetermined frequency by means of such a transmitter tube. It is then required that the tube can be operated alternatingly with varying frequency or fixed frequency as desired, and it is also a requirement that the fixed frequency is the same from time to time, even if the tube during intermediate period has been operated with varying frequency. The fixed frequency should furthermore be adjustable to any value within the tuning range.

Methods have been previously proposed which make possible transmission of a fixed frequency by means of such a tunable tube, which methods are based upon a time control of the triggering under continous variation of the tuning frequency such that triggering is always effected at a certain tuning. This can, for example, be achieved in that a magnitude which is representative for the tuning frequency is compared with an adjustable magnitude and triggering effected at equal values of the two compared magnitudes. Such a control is particularly suitable in the case that it is required to be able to transmit pulses of a number of different predetermined frequencies, for example according to a certain program, but it can also be used for transmission of one single fixed frequency. If it is only of interest to transmit one single frequency such an apparatus is, however, unnecessarily complicated and has, furthermore, the draw-back that the tube is subject to wear in that the rotor body is rotating continuously. In certain cases this method can also result in errors in the frequency determination if, for example, the relation between the real tuning and the magnitude which is representative for the tuning should be changed.

The invention has for its purpose to eliminate these drawbacks and give a simpler solution to the said problem, which also results in increased possibilities of maintaining a certain required frequency and allows rapid switching between transmission with fixed frequency and varying frequency without need for making any modifications of the tube.

The invention is characterized in that such a tunable transmitter tube comprises a tuning body which is rotatably supported in a stator portion which body by rotation in a predetermined direction produces continuous variation of the tuning frequency of the tube. For the purpose of setting the tube to a fixed frequency this tuning body cooperates with an arresting device arranged between the stator portion and the tuning body. The arresting device is ineffective during rotation which produces the variation of the tuning frequency, but functions with a tendency toward rotation in the opposite direction for locking the tuning body in a position corresponding to the predetermined fixed frequency.

The reversal of the rotation direction is effected in a simple way by switching the normal supply wires to the motor. For example, in a two phase motor in order to shift the current direction in one of the windings, whereby no additional leads are required, the switching between transmission with fixed and varying frequency is produced by a simple switching in the supply circuit of the motor.

The arresting device consists suitably of a catch lever which is swingably mounted on the stator portion and adapted to cooperate with a locking disk connected with the tuning body. This disk has a notch into which the catch lever can fall for locking the disk and the tuning body upon rotation of the same in the direction in which the arresting device is effective. According to another feature of the invention, the said catch lever is then frictionally controlled from the rotating body, for example, by means of a frictional spring bearing against the said locking disk so that it upon rotation of the body in one direction is swung to ineffective position. Upon rotation in the opposite direction it is swung in a direction for locking the disk by the catch lever falling into the notch, the catch lever being then maintained in engagement with the notch by feeding continuously torque to the device in the said last direction. By such a simple construction and control of the arresting device this can function continuously and the tube always ready to be used either for transmission of varying frequency or transmission of fixed frequency which switching is effected by reversing the rotation direction.

In order to make possible an accurate adjustment of the fixed frequency the said catch lever can suitably be arranged on a rotatable ring which is set by means of an adjusting screw or the like. The adjustment of the angular position of the said ring and consequently the tuning frequency can be effected manually or automatically, for example, by means of two fixed cavities used for measuring the frequency of the generated pulses and producing a control voltage which by rotation of the said ring varies the frequency to exact coincidence with a value given by the cavities.

Figure 2:
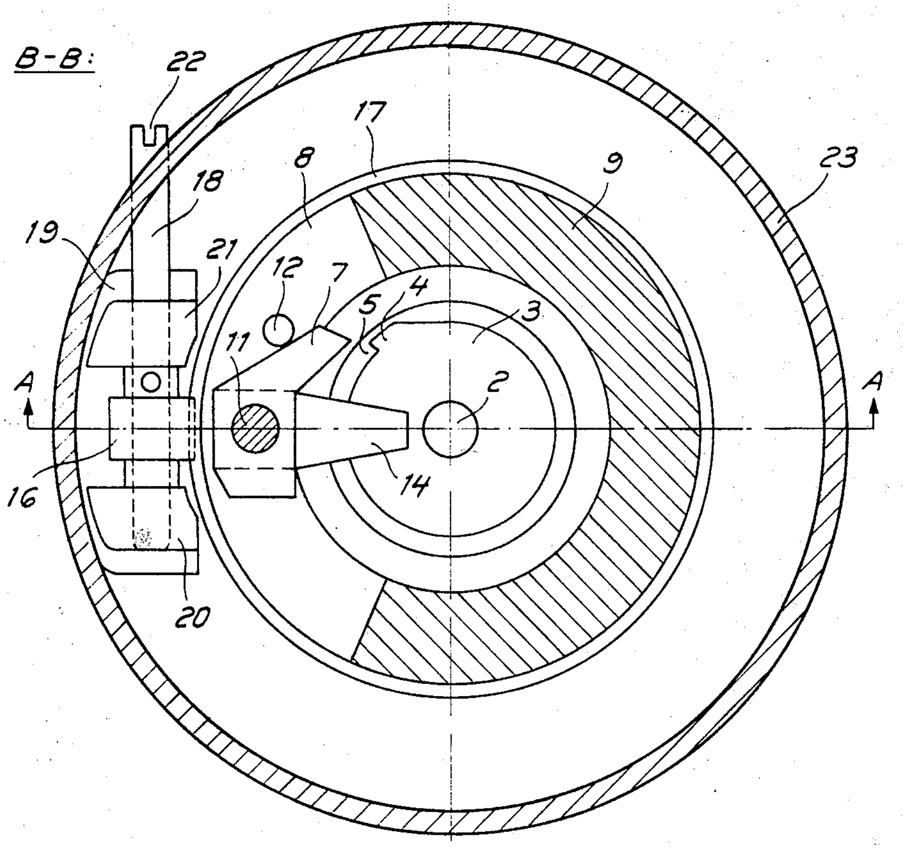
Figure 3:
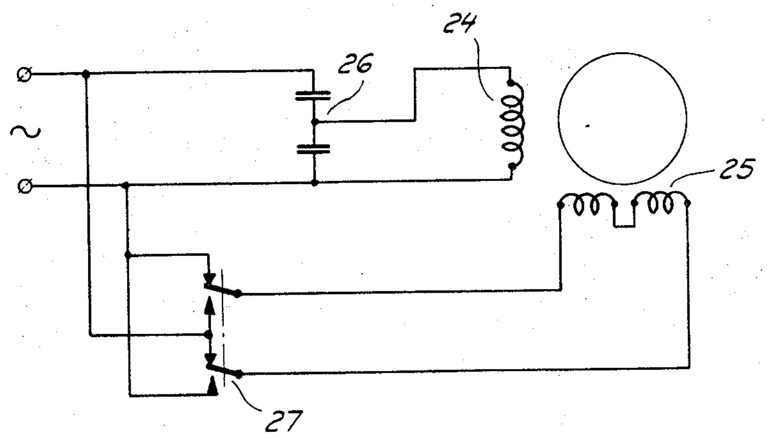
Figures 4, 5:
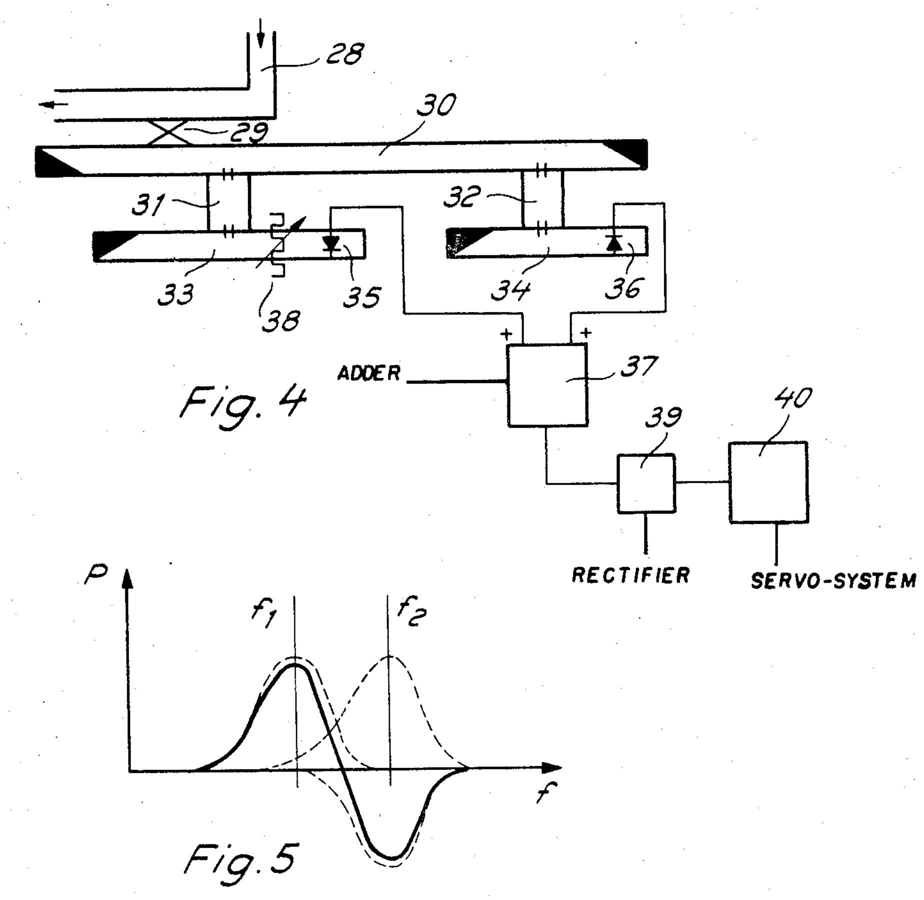

The invention is illustrated in the accompanying drawings in which:

FIGS. 1 and 2 show two perpendicular sectional views of an arresting device according to the invention, FIG. 3 shows a circuit diagram for the supply circuit of the driving motor in the device according to FIG. 1 and 2 with switch for changing the rotation direction, FIG. 4 shows schematically a device for automatic setting of the frequency by means of fixed cavities and FIG. 5 shows a discriminator curve for the device according to FIG. 4.

In FIGS. 1 and 2 reference numeral 1 designates the upper portion of the motor of a tunable magnetron which may, for example, be of the type described in which the tuning frequency depends on the instantaneous position of a rotor body which is connected to a shaft 2 projecting from the motor housing. The rotor shaft is, according to the invention, provided with a locking disk 3 having a projecting portion 4 shaped such that a notch 5 is formed at the periphery of the disk. The disk is fixed to the rotor shaft by means of a conical pin 6 which reduces the play between disk and shaft to zero.

7 is a catch lever adapted to cooperate with the locking disk 3 and situated in a recess 8 in a ring 9. The lever is mounted by means of a bearing 10 on a pin 11 projecting from the ring 9 so that it is swingable between an engagement position with the notch and the inactive position shown. In the inactive position the catch lever bears against a stop pin 12. The ring 9 supporting the catch lever is in turn situated in a ring shaped recess in a part 13 fixedly connected with the motor housing so that it is rotatable relative to the part 13 and consequently relative to the motor housing.

The catch lever is connected with two leaf springs 14, 15 situated on opposite sides of the disk, which springs are pre-stressed such that they are pressed against the disk. The friction against the disk then brings about that upon rotation of the disk in one direction, in the example shown clockwise direction, the catch lever will be brought to the inactive position shown, while it, upon rotation in the opposite direction, also under influence of the friction, will be pressed against the periphery of the locking disk until it engages the notch 5 and locks the disk. As long as the motor produces a torque in counterclockwise direction, the disk will be maintained without play in a certain position, whereby the tuning body will also be maintained in an accurately predetermined position. If the motor is brought to rotate in the said first direction in which the arresting device is ineffective and is then again locked by reversing the direction of rotation, the rotor body will with high accuracy occupy the same position as before.

The bearing 10 which connects the catch lever with the pin 11 has at the inner side somewhat rounded surfaces for allowing a certain oblique setting of the springs 14, 15, whereby it is ensured that the friction pressure between the springs and the disk is maintained at the required value.

The locking position of the disk relative to the motor housing and consequently the tuning frequency is determined by the position of the catch lever which in turn depends on the angular setting of the ring 9. The ring 9 is, as mentioned, rotatably supported in the mount portion 13, which is fixedly connected to the upper portion of the motor housing, and is adjusted by means of an adjusting screw 16 engaging teeth 17 on the outside of ring 9. The adjusting screw 16 is arranged on a shaft 18 which is supported by two mounts 20, 21 situated in a recess 19 in the portion 13. Setting of shaft 18 and thereby of ring 9 may, for example, be effected manually by means of a screw driver or the like which is put into engagement with a groove 22 in the end surface of the shaft 18. Alternatively the shaft 18 can be connected with a servo motor for automatic setting of the ring 9 and thereby the tuning frequency in a manner described more in detail in the following.

For protecting the described locking and adjusting mechanism mechanically there is a lid 23 which is hermetically connected to the part 13.

FIG. 3 shows the principle for reversing the direction of rotation when using a two phase motor. The motor has according to the drawing two windings 24, 25 arranged 90° to each other and fed from a supply source of for example 400 c./s., one of the windings 24 being supplied through a phase shift network 26 and the other winding 25 through a switch 27. The phase shift network is dimensioned such that the voltage across winding 24 is substantially 90° phase displaced relative to the voltage across winding 25. Actuation of switch 27 produces reversion of the voltage across winding 25, i.e. a phase displacement of 180°. This means that the voltage across windings 24 and 25 will still be 90° phase displaced but with another sign than previously. The rotor will consequently rotate in one direction when the switch is in its first position and in opposite direction when the switch is brought to its other position.

FIG. 4 shows a simple example of automatic setting of the tuning frequency by means of two cavities. 28 is a wave guide which leads the generated pulses from the magnetron to an antenna in the direction indicated by the arrow and 29 is a directional coupling device which transmits a small portion of the energy to a wave guide 30. This wave guide is coupled through two cavity resonators 31, 32 with two other wave guides 33, 34 in which detectors 35, 36 are arranged in opposite direction. The voltage from the detectors are applied to an adding amplifier the output voltage of which due to the opposite arrangement of the detectors will be a measure of the difference between the pulse coupled through resonator 31 and the pulse coupled through resonator 32. In one of the wave guides 33, 34 for example wave guide 33, there is furthermore a variable attenuator 38 for ensuring that similar input pulses give rise to equal voltage pulses from the respective detector.

The resonators 31, 32 are tuned somewhat differently as shown in FIG. 5 where $f_1$ is the resonance frequency of resonator 31 and $f_2$ the resonance frequency of resonator 32. The two curves drawn in dotted lines in FIG. 5 represent the energy coupled through the respective resonator at different frequencies and the curve drawn in full line represents the output voltage from the adding amplifier 37 as a function of the frequency. The output voltage from amplifier 37 will, as shown, pass zero at a frequency of incoming pulses situated half way between $f_1$ and $f_2$. The output voltage from 37 is rectified in a peak rectifier 39 the output voltage of which is applied to a servo mechanism indicated by block 40. The device 40 contains a servomotor which is coupled to the adjusting shaft 18 and which thereby produces adjustment of the tuning frequency of the magnetron. Thus, a closed regulation circuit is formed in which the output voltage from adding amplifier 37 serves an error voltage and is supplied to the servomotor acting upon the ring 9 with such polarity that the output voltage from 37 is regulated to zero (negative feed-back). The magnetron frequency will, by this means, be adjusted automatically to a value lying half way between $f_1$ and $f_2$. The closed regulation circuit will also produce a continuous monitoring of the magnetron frequency, which will be only determined by the cavities 31, 32.

What is claimed is:

1. A device for transmitting an accurately predetermined fixed frequency by means of a tunable high frequency transmitter tube comprising a stator, a tuning body rotatably supported within said stator, means to rotate said tuning body in a predetermined direction of rotation to effect a continuous variation of the tuning frequency of the tube, an arresting device positioned between the stator and the tuning body, said arresting device being inoperative during rotation of said tuning body which produces a variation of the tuning frequency, means to reverse the direction of rotation of the tuning body, and means effective on reversal of the direction of rotation of the tuning body for locking the tuning body in a position corresponding to the predetermined frequency.

2. A device as claimed in claim 1, in which the arresting device consists of a catch lever swingably mounted on the stator portion and adapted to cooperate with a locking disk connected with the tuning body, which disk has a notch into which the catch lever can fall for locking the disk and thereby the tuning body during rotation of the same in the effective direction of the arresting device, said catch lever being frictionally controlled from the rotating body, whereby upon rotation of the body in one direction it is swung to an ineffective position and with rotation in an opposite direction it is swung in a direction to the locking disk for engaging the notch, whereafter the catch lever is kept in engagement by continuously applying torque in the said latter direction.

3. A device as claimed in claim 1 wherein the arresting device is mounted on a rotatable ring for adjusting the fixed frequency.

4. A device as claimed in claim 3 including a measuring device connected to the output of the transmitter tube and adapted to measure the frequency of generated pulses and generate a control signal, a servomotor responsive to said control signal and forming with said measuring device a closed regulation loop, said arresting device being regulated by negative feedback to a position which corresponds to a predetermined tuning frequency of the magnetron as measured by the measuring device.

5. A device as claimed in claim 3 wherein the catch lever is frictionally controlled from the rotating body by means of frictional springs bearing against the locking disk.

References Cited

UNITED STATES PATENTS

| | | | |
|---|---|---|---|
| 2,209,273 | 7/1940 | Hills | 325—131X |
| 2,527,699 | 10/1950 | Bowen et al. | 313—149X |
| 3,154,739 | 10/1964 | Thomas et al. | 325—127X |
| 3,379,925 | 4/1968 | Edwards | 313—149X |

RICHARD MURRAY, Primary Examiner

B. V. SAFOUREK, Assistant Examiner

U.S. Cl. X.R.

325—120; 331—179